United States Patent
Tung et al.

(10) Patent No.: US 7,476,327 B2
(45) Date of Patent: Jan. 13, 2009

(54) METHOD OF MANUFACTURE FOR MICROELECTROMECHANICAL DEVICES

(75) Inventors: Ming-Hau Tung, Santa Clara, CA (US); Brian James Gally, San Rafael, CA (US); Manish Kothari, Redwood City, CA (US); Clarence Chui, San Mateo, CA (US); John Batey, San Francisco, CA (US)

(73) Assignee: IDC, LLC, Pleasanton, CA (US)

( * ) Notice: Subject to any disclaimer, the term of this patent is extended or adjusted under 35 U.S.C. 154(b) by 302 days.

(21) Appl. No.: 10/839,329

(22) Filed: May 4, 2004

(65) Prior Publication Data

US 2005/0249966 A1    Nov. 10, 2005

(51) Int. Cl.
*B21D 39/00* (2006.01)
(52) U.S. Cl. ............................................. 216/2; 216/72
(58) Field of Classification Search ........................ None
See application file for complete search history.

(56) References Cited

U.S. PATENT DOCUMENTS

| | | | |
|---|---|---|---|
| 2,534,846 | A | 12/1950 | Ambrose et al. |
| 3,296,530 | A | 1/1967 | Brooks |
| 3,439,973 | A | 4/1969 | Paul et al. |
| 3,443,854 | A | 5/1969 | Weiss |
| 3,653,741 | A | 4/1972 | Marks |
| 3,656,836 | A | 4/1972 | de Cremoux et al. |
| 3,725,868 | A | 4/1973 | Malmer, Jr. et al. |
| 3,813,265 | A | 5/1974 | Marks |
| 3,955,880 | A | 5/1976 | Lierke |
| 4,099,854 | A | 7/1978 | Decker et al. |
| 4,196,396 | A | 4/1980 | Smith |
| 4,228,437 | A | 10/1980 | Shelton |
| 4,377,324 | A | 3/1983 | Durand et al. |
| 4,389,096 | A | 6/1983 | Hori et al. |
| 4,392,711 | A | 7/1983 | Moraw et al. |
| 4,403,248 | A | 9/1983 | te Velde |
| 4,441,791 | A | 4/1984 | Hornbeck |
| 4,445,050 | A | 4/1984 | Marks |
| 4,459,182 | A | 7/1984 | te Velde |
| 4,482,213 | A | 11/1984 | Piliavin et al. |

(Continued)

FOREIGN PATENT DOCUMENTS

DE    4108966 A1    9/1992

(Continued)

OTHER PUBLICATIONS

Akasaka, "Three Dimensional IC Trends", Proceedings of IEEE, vol. 74, No. 12, pp. 1703-1714, (Dec. 1986).

(Continued)

*Primary Examiner*—Allan Olsen
(74) *Attorney, Agent, or Firm*—Knobbe Martens Olson & Bear, LLP

(57) ABSTRACT

A method of manufacturing a microelectromechanical device includes forming at least two conductive layers on a substrate. An isolation layer is formed between the two conductive layers. The conductive layers are electrically coupled together and then the isolation layer is removed to form a gap between the conductive layers. The electrical coupling of the layers mitigates or eliminates the effects of electrostatic charge build up on the device during the removal process.

14 Claims, 4 Drawing Sheets

U.S. PATENT DOCUMENTS

| | | |
|---|---|---|
| 4,500,171 A | 2/1985 | Penz et al. |
| 4,519,676 A | 5/1985 | te Velde |
| 4,531,126 A | 7/1985 | Sadones |
| 4,566,935 A | 1/1986 | Hornbeck |
| 4,571,603 A | 2/1986 | Hornbeck et al. |
| 4,596,992 A | 6/1986 | Hornbeck |
| 4,615,595 A | 10/1986 | Hornbeck |
| 4,662,746 A | 5/1987 | Hornbeck |
| 4,663,083 A | 5/1987 | Marks |
| 4,666,254 A | 5/1987 | Itoh et al. |
| 4,681,403 A | 7/1987 | te Velde et al. |
| 4,710,732 A | 12/1987 | Hornbeck |
| 4,748,366 A | 5/1988 | Taylor |
| 4,786,128 A | 11/1988 | Birnbach |
| 4,790,635 A | 12/1988 | Apsley |
| 4,856,863 A | 8/1989 | Sampsell et al. |
| 4,857,978 A | 8/1989 | Goldburt et al. |
| 4,859,060 A | 8/1989 | Katagiri et al. |
| 4,900,136 A | 2/1990 | Goldburt et al. |
| 4,900,395 A | 2/1990 | Syverson et al. |
| 4,937,496 A | 6/1990 | Neiger et al. |
| 4,954,789 A | 9/1990 | Sampsell |
| 4,956,619 A | 9/1990 | Hornbeck |
| 4,965,562 A | 10/1990 | Verhulst |
| 4,982,184 A | 1/1991 | Kirkwood |
| 5,018,256 A | 5/1991 | Hornbeck |
| 5,022,745 A | 6/1991 | Zahowski et al. |
| 5,028,939 A | 7/1991 | Hornbeck et al. |
| 5,037,173 A | 8/1991 | Sampsell et al. |
| 5,044,736 A | 9/1991 | Jaskie et al. |
| 5,061,049 A | 10/1991 | Hornbeck |
| 5,075,796 A | 12/1991 | Schildkraut et al. |
| 5,078,479 A | 1/1992 | Vuilleumier |
| 5,079,544 A | 1/1992 | DeMond et al. |
| 5,083,857 A | 1/1992 | Hornbeck |
| 5,096,279 A | 3/1992 | Hornbeck et al. |
| 5,099,353 A | 3/1992 | Hornbeck |
| 5,124,834 A | 6/1992 | Cusano et al. |
| 5,136,669 A | 8/1992 | Gerdt |
| 5,142,405 A | 8/1992 | Hornbeck |
| 5,142,414 A | 8/1992 | Koehler |
| 5,153,771 A | 10/1992 | Link et al. |
| 5,162,787 A | 11/1992 | Thompson et al. |
| 5,168,406 A | 12/1992 | Nelson |
| 5,170,156 A | 12/1992 | DeMond et al. |
| 5,172,262 A | 12/1992 | Hornbeck |
| 5,179,274 A | 1/1993 | Sampsell |
| 5,192,395 A | 3/1993 | Boysel et al. |
| 5,192,946 A | 3/1993 | Thompson et al. |
| 5,206,629 A | 4/1993 | DeMond et al. |
| 5,212,582 A | 5/1993 | Nelson |
| 5,214,419 A | 5/1993 | DeMond et al. |
| 5,214,420 A | 5/1993 | Thompson et al. |
| 5,216,537 A | 6/1993 | Hornbeck |
| 5,226,099 A | 7/1993 | Mignardi et al. |
| 5,228,013 A | 7/1993 | Bik |
| 5,231,532 A | 7/1993 | Magel et al. |
| 5,233,385 A | 8/1993 | Sampsell |
| 5,233,456 A | 8/1993 | Nelson |
| 5,233,459 A | 8/1993 | Bozler et al. |
| 5,254,980 A | 10/1993 | Hendrix et al. |
| 5,272,473 A | 12/1993 | Thompson et al. |
| 5,278,652 A | 1/1994 | Urbanus et al. |
| 5,280,277 A | 1/1994 | Hornbeck |
| 5,287,096 A | 2/1994 | Thompson et al. |
| 5,293,272 A | 3/1994 | Jannson et al. |
| 5,296,950 A | 3/1994 | Lin et al. |
| 5,305,640 A | 4/1994 | Boysel et al. |
| 5,311,360 A | 5/1994 | Bloom et al. |
| 5,312,513 A | 5/1994 | Florence et al. |
| 5,323,002 A | 6/1994 | Sampsell et al. |
| 5,324,683 A | 6/1994 | Fitch et al. |
| 5,325,116 A | 6/1994 | Sampsell |
| 5,326,430 A | 7/1994 | Cronin et al. |
| 5,327,286 A | 7/1994 | Sampsell et al. |
| 5,331,454 A | 7/1994 | Hornbeck |
| 5,339,116 A | 8/1994 | Urbanus et al. |
| 5,345,328 A | 9/1994 | Fritz et al. |
| 5,355,357 A | 10/1994 | Yamamori et al. |
| 5,358,601 A | 10/1994 | Cathey |
| 5,365,283 A | 11/1994 | Doherty et al. |
| 5,381,232 A | 1/1995 | Van Wijk |
| 5,381,253 A | 1/1995 | Sharp et al. |
| 5,401,983 A | 3/1995 | Jokerst et al. |
| 5,411,769 A | 5/1995 | Hornbeck |
| 5,444,566 A | 8/1995 | Gale et al. |
| 5,446,479 A | 8/1995 | Thompson et al. |
| 5,448,314 A | 9/1995 | Heimbuch et al. |
| 5,452,024 A | 9/1995 | Sampsell |
| 5,454,906 A | 10/1995 | Baker et al. |
| 5,457,493 A | 10/1995 | Leddy et al. |
| 5,457,566 A | 10/1995 | Sampsell et al. |
| 5,459,602 A | 10/1995 | Sampsell |
| 5,459,610 A | 10/1995 | Bloom et al. |
| 5,461,411 A | 10/1995 | Florence et al. |
| 5,474,865 A | 12/1995 | Vasudev |
| 5,489,952 A | 2/1996 | Gove et al. |
| 5,497,172 A | 3/1996 | Doherty et al. |
| 5,497,197 A | 3/1996 | Gove et al. |
| 5,499,037 A | 3/1996 | Nakagawa et al. |
| 5,499,062 A | 3/1996 | Urbanus |
| 5,500,635 A | 3/1996 | Mott |
| 5,500,761 A | 3/1996 | Goossen et al. |
| 5,506,597 A | 4/1996 | Thompson et al. |
| 5,515,076 A | 5/1996 | Thompson et al. |
| 5,517,347 A | 5/1996 | Sampsell |
| 5,523,803 A | 6/1996 | Urbanus et al. |
| 5,526,051 A | 6/1996 | Gove et al. |
| 5,526,172 A | 6/1996 | Kanack |
| 5,526,327 A | 6/1996 | Cordova, Jr. |
| 5,526,688 A | 6/1996 | Boysel et al. |
| 5,535,047 A | 7/1996 | Hornbeck |
| 5,548,301 A | 8/1996 | Kornher et al. |
| 5,551,293 A | 9/1996 | Boysel et al. |
| 5,552,924 A | 9/1996 | Tregilgas |
| 5,552,925 A | 9/1996 | Worley |
| 5,559,358 A | 9/1996 | Burns et al. |
| 5,563,398 A | 10/1996 | Sampsell |
| 5,567,334 A | 10/1996 | Baker et al. |
| 5,570,135 A | 10/1996 | Gove et al. |
| 5,579,149 A | 11/1996 | Moret et al. |
| 5,581,272 A | 12/1996 | Conner et al. |
| 5,583,688 A | 12/1996 | Hornbeck |
| 5,589,852 A | 12/1996 | Thompson et al. |
| 5,597,736 A | 1/1997 | Sampsell |
| 5,600,383 A | 2/1997 | Hornbeck |
| 5,602,671 A | 2/1997 | Hornbeck |
| 5,606,441 A | 2/1997 | Florence et al. |
| 5,608,468 A | 3/1997 | Gove et al. |
| 5,610,438 A | 3/1997 | Wallace et al. |
| 5,610,624 A | 3/1997 | Bhuva |
| 5,610,625 A | 3/1997 | Sampsell |
| 5,614,937 A | 3/1997 | Nelson |
| 5,619,059 A | 4/1997 | Li et al. |
| 5,619,061 A * | 4/1997 | Goldsmith et al. .......... 257/528 |
| 5,619,365 A | 4/1997 | Rhoads et al. |
| 5,619,366 A | 4/1997 | Rhoads et al. |
| 5,629,790 A | 5/1997 | Neukermans et al. |
| 5,633,652 A | 5/1997 | Kanbe et al. |
| 5,636,052 A | 6/1997 | Arney et al. |
| 5,636,185 A | 6/1997 | Brewer et al. |
| 5,638,084 A | 6/1997 | Kalt |
| 5,638,946 A | 6/1997 | Zavracky |
| 5,641,391 A | 6/1997 | Hunter et al. |

| | | | | | | |
|---|---|---|---|---|---|---|
| 5,646,768 | A | 7/1997 | Kaeriyama | 6,376,787 B1 | 4/2002 | Martin et al. |
| 5,650,881 | A | 7/1997 | Hornbeck | 6,407,851 B1 | 6/2002 | Islam et al. |
| 5,654,741 | A | 8/1997 | Sampsell et al. | 6,417,868 B1 | 7/2002 | Bock et al. |
| 5,657,099 | A | 8/1997 | Doherty et al. | 6,438,282 B1 | 8/2002 | Takeda et al. |
| 5,659,374 | A | 8/1997 | Gale, Jr. et al. | 6,447,126 B1 | 9/2002 | Hornbeck |
| 5,661,591 | A | 8/1997 | Lin et al. | 6,449,084 B1 | 9/2002 | Guo |
| 5,665,997 | A | 9/1997 | Weaver et al. | 6,456,420 B1 | 9/2002 | Goodwin-Johansson |
| 5,673,139 | A | 9/1997 | Johnson | 6,465,355 B1 | 10/2002 | Horsley |
| 5,683,591 | A | 11/1997 | Offenberg | 6,466,190 B1 | 10/2002 | Evoy |
| 5,703,710 | A | 12/1997 | Brinkman et al. | 6,466,354 B1 | 10/2002 | Gudeman |
| 5,710,656 | A | 1/1998 | Goosen | 6,466,358 B2 | 10/2002 | Tew |
| 5,726,480 | A | 3/1998 | Pister | 6,473,072 B1 | 10/2002 | Comiskey et al. |
| 5,739,945 | A | 4/1998 | Tayebati | 6,473,274 B1 | 10/2002 | Maimone et al. |
| 5,740,150 | A | 4/1998 | Uchimaru et al. | 6,480,177 B2 | 11/2002 | Doherty et al. |
| 5,745,193 | A | 4/1998 | Urbanus et al. | 6,496,122 B2 | 12/2002 | Sampsell |
| 5,745,281 | A | 4/1998 | Yi et al. | 6,545,335 B2 | 4/2003 | Chua et al. |
| 5,751,469 | A | 5/1998 | Arney et al. | 6,548,908 B2 | 4/2003 | Chua et al. |
| 5,771,116 | A | 6/1998 | Miller et al. | 6,549,338 B1 | 4/2003 | Wolverton et al. |
| 5,784,190 | A | 7/1998 | Worley | 6,552,840 B2 | 4/2003 | Knipe |
| 5,784,212 | A | 7/1998 | Hornbeck | 6,574,033 B1 | 6/2003 | Chui et al. |
| 5,786,927 | A | 7/1998 | Greywall et al. | 6,589,625 B1 | 7/2003 | Kothari et al. |
| 5,793,504 | A | 8/1998 | Stoll | 6,600,201 B2 | 7/2003 | Hartwell et al. |
| 5,808,780 | A | 9/1998 | McDonald | 6,606,175 B1 | 8/2003 | Sampsell et al. |
| 5,808,781 | A | 9/1998 | Arney et al. | 6,607,935 B2 * | 8/2003 | Kwon ........................ 438/56 |
| 5,818,095 | A | 10/1998 | Sampsell | 6,608,268 B1 | 8/2003 | Goldsmith |
| 5,825,528 | A | 10/1998 | Goosen | 6,624,944 B1 | 9/2003 | Wallace et al. |
| 5,835,255 | A | 11/1998 | Miles | 6,625,047 B2 | 9/2003 | Coleman, Jr. |
| 5,838,484 | A | 11/1998 | Goossen et al. | 6,630,786 B2 | 10/2003 | Cummings et al. |
| 5,842,088 | A | 11/1998 | Thompson | 6,632,698 B2 | 10/2003 | Ives |
| 5,867,302 | A * | 2/1999 | Fleming ..................... 359/291 | 6,635,919 B1 | 10/2003 | Melendez et al. |
| 5,905,482 | A | 5/1999 | Hughes et al. | 6,643,069 B2 | 11/2003 | Dewald |
| 5,912,758 | A | 6/1999 | Knipe et al. | 6,650,455 B2 | 11/2003 | Miles |
| 5,943,158 | A | 8/1999 | Ford et al. | 6,657,832 B2 | 12/2003 | Williams et al. |
| 5,959,763 | A | 9/1999 | Bozler et al. | 6,660,656 B2 | 12/2003 | Cheung et al. |
| 5,986,796 | A | 11/1999 | Miles | 6,666,561 B1 | 12/2003 | Blakley |
| 5,994,174 | A | 11/1999 | Carey et al. | 6,674,090 B1 | 1/2004 | Chua et al. |
| 6,028,690 | A | 2/2000 | Carter et al. | 6,674,562 B1 | 1/2004 | Miles et al. |
| 6,038,056 | A | 3/2000 | Florence et al. | 6,674,563 B2 | 1/2004 | Chui et al. |
| 6,040,937 | A | 3/2000 | Miles | 6,680,792 B2 | 1/2004 | Miles |
| 6,046,840 | A | 4/2000 | Huibers | 6,707,355 B1 * | 3/2004 | Yee ............................ 335/78 |
| 6,049,317 | A | 4/2000 | Thompson et al. | 6,710,908 B2 | 3/2004 | Miles et al. |
| 6,055,090 | A | 4/2000 | Miles | 6,741,377 B2 | 5/2004 | Miles |
| 6,056,406 | A | 5/2000 | Park et al. | 6,741,383 B2 | 5/2004 | Huibers et al. |
| 6,061,075 | A | 5/2000 | Nelson et al. | 6,741,384 B1 | 5/2004 | Martin et al. |
| 6,097,145 | A | 8/2000 | Kastalsky et al. | 6,741,503 B1 | 5/2004 | Farris et al. |
| 6,099,132 | A | 8/2000 | Kaeriyama | 6,747,785 B2 | 6/2004 | Chen et al. |
| 6,100,872 | A | 8/2000 | Aratani et al. | 6,747,800 B1 | 6/2004 | Lin |
| 6,113,239 | A | 9/2000 | Sampsell et al. | 6,775,174 B2 | 8/2004 | Huffman et al. |
| 6,115,014 | A | 9/2000 | Aoki et al. | 6,778,155 B2 | 8/2004 | Doherty et al. |
| 6,147,790 | A | 11/2000 | Meier et al. | 6,794,119 B2 | 9/2004 | Miles |
| 6,158,156 | A | 12/2000 | Patrick | 6,809,788 B2 | 10/2004 | Yamada et al. |
| 6,160,833 | A | 12/2000 | Floyd et al. | 6,811,267 B1 | 11/2004 | Allen et al. |
| 6,171,945 | B1 | 1/2001 | Mandal et al. | 6,819,469 B1 | 11/2004 | Koba |
| 6,172,797 | B1 | 1/2001 | Huibers | 6,822,628 B2 | 11/2004 | Dunphy et al. |
| 6,180,428 | B1 | 1/2001 | Peeters et al. | 6,829,132 B2 | 12/2004 | Martin et al. |
| 6,195,196 | B1 | 2/2001 | Kimura et al. | 6,841,081 B2 | 1/2005 | Chang et al. |
| 6,201,633 | B1 | 3/2001 | Peeters et al. | 6,853,129 B1 | 2/2005 | Cummings et al. |
| 6,215,221 | B1 | 4/2001 | Cabuz et al. | 6,855,610 B2 | 2/2005 | Tung et al. |
| 6,232,936 | B1 | 5/2001 | Gove et al. | 6,859,218 B1 | 2/2005 | Luman et al. |
| 6,239,777 | B1 | 5/2001 | Sugahara et al. | 6,861,277 B1 | 3/2005 | Monroe et al. |
| 6,243,149 | B1 | 6/2001 | Swanson et al. | 6,862,022 B2 | 3/2005 | Slupe |
| 6,282,010 | B1 | 8/2001 | Sulzbach et al. | 6,862,029 B1 | 3/2005 | D'Souza et al. |
| 6,288,472 | B1 | 9/2001 | Cabuz et al. | 6,867,896 B2 | 3/2005 | Miles |
| 6,288,824 | B1 | 9/2001 | Kastalsky | 6,870,581 B2 | 3/2005 | Li et al. |
| 6,295,154 | B1 | 9/2001 | Laor et al. | 6,870,654 B2 | 3/2005 | Lin et al. |
| 6,316,289 | B1 | 11/2001 | Chung | 6,882,458 B2 | 4/2005 | Lin et al. |
| 6,323,982 | B1 | 11/2001 | Hornbeck | 6,882,461 B1 | 4/2005 | Tsai et al. |
| 6,327,071 | B1 | 12/2001 | Kimura | 6,891,658 B2 | 5/2005 | Whitehead et al. |
| 6,331,909 | B1 | 12/2001 | Dunfield | 6,912,022 B2 | 6/2005 | Lin et al. |
| 6,335,831 | B2 | 1/2002 | Kowarz et al. | 6,917,268 B2 * | 7/2005 | Deligianni et al. ............ 335/78 |
| 6,356,254 | B1 | 3/2002 | Kimura | 6,947,200 B2 | 9/2005 | Huibers |
| 6,356,378 | B1 | 3/2002 | Huibers | 6,952,303 B2 | 10/2005 | Lin et al. |
| 6,358,021 | B1 | 3/2002 | Cabuz | 6,958,847 B2 | 10/2005 | Lin |

6,959,990 B2 11/2005 Penn
7,008,812 B1 3/2006 Carley
7,053,737 B2 5/2006 Schwartz et al.
7,075,700 B2 7/2006 Muenter
7,123,216 B1 10/2006 Miles
7,236,284 B2 6/2007 Miles
7,372,613 B2 5/2008 Chui et al.
2001/0003487 A1 6/2001 Miles
2001/0028503 A1 10/2001 Flanders et al.
2002/0014579 A1 2/2002 Dunfield
2002/0015215 A1 2/2002 Miles
2002/0021485 A1 2/2002 Pilossof
2002/0024711 A1 2/2002 Miles
2002/0027636 A1 3/2002 Yamada
2002/0054424 A1 5/2002 Miles
2002/0075555 A1 6/2002 Miles
2002/0114558 A1 8/2002 Nemirovsky
2002/0126364 A1 9/2002 Miles
2002/0139981 A1 10/2002 Young
2002/0146200 A1 10/2002 Kurdle et al.
2002/0149828 A1 10/2002 Miles
2002/0149850 A1 10/2002 Heffner et al.
2002/0167072 A1 11/2002 Andosca
2002/0167730 A1 11/2002 Needham et al.
2002/0186483 A1 12/2002 Hagelin et al.
2003/0015936 A1 1/2003 Yoon et al.
2003/0016428 A1 1/2003 Kato et al.
2003/0029705 A1 2/2003 Qui et al.
2003/0043157 A1 3/2003 Miles
2003/0053078 A1 3/2003 Missey et al.
2003/0072070 A1 4/2003 Miles
2003/0156315 A1 8/2003 Li et al.
2003/0202264 A1 10/2003 Weber et al.
2003/0202265 A1 10/2003 Reboa et al.
2003/0202266 A1 10/2003 Ring et al.
2003/0210851 A1 11/2003 Fu et al.
2004/0008396 A1 1/2004 Stappaerts
2004/0008438 A1 1/2004 Sato
2004/0027671 A1 2/2004 Wu et al.
2004/0027701 A1 2/2004 Ishikawa
2004/0051929 A1 3/2004 Sampsell et al.
2004/0056742 A1 3/2004 Dabbaj
2004/0058532 A1 3/2004 Miles et al.
2004/0075967 A1 4/2004 Lynch et al.
2004/0080035 A1 4/2004 Delapierre
2004/0080807 A1 4/2004 Chen et al.
2004/0100594 A1 5/2004 Huibers et al.
2004/0100680 A1 5/2004 Huibers et al.
2004/0124483 A1 7/2004 Partridge et al.
2004/0125281 A1 7/2004 Lin
2004/0125347 A1 7/2004 Patel et al.
2004/0136045 A1 7/2004 Tran
2004/0140557 A1 7/2004 Sun et al.
2004/0145049 A1 7/2004 McKinnell et al.
2004/0145811 A1 7/2004 Lin et al.
2004/0147056 A1 7/2004 McKinnell et al.
2004/0147198 A1 7/2004 Lin et al.
2004/0148009 A1 7/2004 Buzzard et al.
2004/0150939 A1 8/2004 Huff
2004/0160143 A1 8/2004 Shreeve et al.
2004/0174583 A1 9/2004 Chen et al.
2004/0175577 A1 9/2004 Lin et al.
2004/0179281 A1 9/2004 Reboa
2004/0179445 A1 9/2004 Park et al.
2004/0184766 A1 9/2004 Kim et al.
2004/0201908 A1 10/2004 Kaneko
2004/0207897 A1 10/2004 Lin
2004/0209192 A1 10/2004 Lin et al.
2004/0209195 A1 10/2004 Lin
2004/0212026 A1 10/2004 Van Brocklin et al.
2004/0217378 A1 11/2004 Martin et al.
2004/0217919 A1 11/2004 Pichl et al.
2004/0218251 A1 11/2004 Piehl et al.
2004/0218334 A1 11/2004 Martin et al.
2004/0218341 A1 11/2004 Martin et al.
2004/0227493 A1 11/2004 Van Brocklin et al.
2004/0233503 A1 11/2004 Kimura
2004/0240032 A1 12/2004 Miles
2004/0240138 A1 12/2004 Martin et al.
2004/0245588 A1 12/2004 Nikkel et al.
2004/0263944 A1 12/2004 Miles et al.
2005/0001828 A1 1/2005 Martin et al.
2005/0002082 A1 1/2005 Miles
2005/0003667 A1 1/2005 Lin et al.
2005/0014374 A1 1/2005 Partridge et al.
2005/0024557 A1 2/2005 Lin
2005/0035699 A1 2/2005 Tsai
2005/0036095 A1 2/2005 Yeh et al.
2005/0036192 A1 2/2005 Lin et al.
2005/0038950 A1 2/2005 Adelmann
2005/0042117 A1 2/2005 Lin
2005/0046922 A1 3/2005 Lin et al.
2005/0046948 A1 3/2005 Lin
2005/0057442 A1 3/2005 Way
2005/0068583 A1 3/2005 Gutkowski et al.
2005/0068605 A1 3/2005 Tsai
2005/0068606 A1 3/2005 Tsai
2005/0069209 A1 3/2005 Damera-Venkata et al.
2005/0078348 A1 4/2005 Lin
2005/0157364 A1 7/2005 Lin
2005/0168849 A1 8/2005 Lin
2005/0195462 A1 9/2005 Lin
2005/0195467 A1 9/2005 Kothari et al.
2005/0202649 A1 9/2005 Hung et al.
2005/0239275 A1 10/2005 Muthukumar et al.
2006/0022966 A1 2/2006 Mar
2006/0044654 A1 3/2006 Vandorpe et al.
2006/0066935 A1 3/2006 Cummings et al.
2006/0077533 A1 4/2006 Miles et al.
2006/0139723 A9 6/2006 Miles et al.
2007/0008607 A1 1/2007 Miles
2007/0229936 A1 10/2007 Miles
2008/0055705 A1 3/2008 Kothari

FOREIGN PATENT DOCUMENTS

DE 10228946 A1 1/2004
EP 0 310 176 A2 4/1989
EP 0 361 981 4/1990
EP 0 667 548 A1 8/1995
EP 0 788 005 8/1997
EP 1275997 1/2003
EP 1 435 336 7/2004
EP 1 473 691 A 11/2004
EP 1473581 A2 11/2004
EP 1484635 12/2004
FR 2 824 643 A 11/2002
JP 62 082454 4/1987
JP 04-276721 10/1992
JP 05275401 A1 10/1993
JP 9-127439 5/1997
JP 11211999 8/1999
JP 11211999 A 11/1999
JP 2000306515 A 11/2000
JP 2002-062490 2/2002
JP 2002277771 A 9/2002
JP 2003-195201 7/2003
JP 2003195201 A 7/2003
JP 2004157527 A 6/2004
JP 2004235465 A 8/2004
JP 2004286825 A 10/2004
TW 157313 5/1991
WO WO9530924 11/1995
WO WO9717628 5/1997
WO WO9952006 A2 10/1999
WO WO9952006 A3 10/1999

| | | |
|---|---|---|
| WO | WO 02/079853 | 10/2002 |
| WO | WO03007049 A1 | 1/2003 |
| WO | WO 03/014789 A2 | 2/2003 |
| WO | 2003/054925 A | 7/2003 |
| WO | WO 03/054925 | 7/2003 |
| WO | 2003/069413 A | 8/2003 |
| WO | WO 03/069404 | 8/2003 |
| WO | WO03069413 A1 | 8/2003 |
| WO | WO03073151 A1 | 9/2003 |
| WO | WO 03/085728 A1 | 10/2003 |
| WO | WO04006003 A1 | 1/2004 |
| WO | WO04026757 A2 | 4/2004 |
| WO | WO 2005/006364 A1 | 1/2005 |
| WO | WO 2006/014929 | 2/2006 |

OTHER PUBLICATIONS

Aratani et al., "Process and Design Considerations for Surface Micromachined Beams for a Tuneable Interferometer Array in Silicon," Proc. IEEE Microelectromechanical Workshop, Fort Lauderdale, FL, pp. 230-235 (Feb. 1993).
Aratani K., et al., "Surface micromachined tuneable interferometer array," Sensors and Actuators, pp. 17-23. (1994).
Bass, "Handbook of Optics, vol. I, Fundamentals, Techniques, and Design, Second Edition," McGraw-Hill, Inc., New York, pp. 2.29-2.36 (1995).
Conner, "Hybrid Color Display Using Optical Interference Filter Array," SID Digest, pp. 577-580 (1993).
Giles et al., "A Silicon MEMS Optical Switch Attenuator and Its Use in Lightwave Subsystems," IEEE Journal of Selected Topics in Quanum Electronics, vol. 5, No. 1, pp. 18-25, (Jan./Feb. 1999).
Goossen et al., "Possible Display Applications of the Silicon Mechanical Anti-Reflection Switch," Society for Information Display (1994).
Goossen et al., "Silicon Modulator Based on Mechanically-Active Anti-Reflection Layer with 1Mbit/sec Capability for Fiber-in-the-Loop Applications," IEEE Photonics Technology Letters, pp. 1119, 1121 (Sep. 1994).
Gosch, "West Germany Grabs the Lead in X-Ray Lithography," Electronics pp. 78-80 (Feb. 5, 1987).
Howard et al., "Nanometer-Scale Fabrication Techniques", VLSI Electronics: Microstructure Science, vol. 5, pp. 143-153 and pp. 166-173 (1982).
Ibbotson et al., "Comparison of XeF2 and F-atom reactions with Si and SiO2," Applied Physics Letters, vol. 44, No. 12, pp. 1129-1131 (Jun. 1984).
Jackson "Classical Electrodynamics", John Wiley & Sons Inc., pp. 568-573. (date unknown).
Jerman et al., "A Miniature Fabry-Perot Interferometer with a Corrugated Silicon Diaphragm Support", (1988).
Johnson "Optical Scanners", Microwave Scanning Antennas, vol. 1, p. 251-261, (1964).
Light over Matter, Circle No. 36 (Jun. 1993).
Miles, Mark, W., "A New Reflective FPD Technology Using Interferometric Modulation", The Proceedings of the Society for Information Display (May 11-16, 1997).
Newsbreaks, "Quantum-trench devices might operate at terahertz frequencies", Laser Focus World (May 1993).
Oliner et al., "Radiating Elements and Mutual Coupling", Microwave Scanning Antennas, vol. 2, pp. 131-141, (1966).
Raley et al., "A Fabry-Perot Microinterferometer for Visible Wavelengths", IEEE Solid-State Sensor and Actuator Workshop, Jun. 1992, Hilton Head, SC.
Schnakenberg, et al. TMAHW Etchants for Silicon Micromachining. 1991 International Conference on Solid State Sensors and Actuators-Digest of Technical Papers. pp. 815-818.
Sperger et al., "High Performance Patterned All-Dielectric Interference Colour Filter for Display Applications", SID Digest, pp. 81-83, (1994).
Stone, "Radiation and Optics, An Introduction to the Classical Theory", McGraw-Hill, pp. 340-343, (1963).

Walker, et al., "Electron-beam-tunable Interference Filter Spatial Light Modulator", Optics Letters vol. 13, No. 5, pp. 345-347, (May 1988).
Williams, et al. Etch Rates for Micromachining Processing. Journal of Microelectromechanical Systems, vol. 5, No. 4, pp. 256-259, (Dec. 1996).
Winters, et al. The etching of silicon with XeF2 vapor. Applied Physics Letters, vol. 34, No. 1, pp. 70-73, (Jan. 1979).
Winton, John M., "A novel way to capture solar energy", Chemical Week, (May 1985).
Wu, "Design of a Reflective Color LCD Using Optical Interference Reflectors", Asia Display '95, pp. 929-931, (Oct. 1995).
Butler et al., "An Embedded Overlay Concept for Microsystems Packaging," IEEE Transactions on Advanced Packaging IEEE USA, vol. 23, No. 4, pp. 617-622, XP002379648 (2000).
Chiou et al., "A Novel Capacitance Control Design of Tunable Capacitor Using Multiple Electrostatic Driving Electrodes," IEEE NANO 2001, M 3.1, Nanoelectronics and Giga-Scale Systems (Special Session), Oct. 29, 2001, pp. 319-324.
Chunjun Wang et al., "Flexible curcuit-based RF MEMS Switches," MEMS. XP002379649 pp. 757-762, (Nov. 2001).
Goossen, "MEMS-based variable optical interference devices," Optical MEMS, 2000 IEEE/LEDS Int'l. Conf. on Aug. 21-24, 2000, Piscatawny, NJ, Aug. 21, 2000, pp. 17-18.
Jerman et al., "Miniature Fabry-Perot Interferometers Micromachined in Silicon for Use in Optical Fiber WDM Systems," Transducers, San Francisco, Jun. 24-27, 1991, Proceedings on the Int'l. Conf. on Solid State Sensors and Actuators, vol. CONF. 6, Jun. 24, 1991, pp. 372-375.
Joannopoulos et al., "Molding the Flow of Light," Photonic Crystals. 1995.
Nagami et al., "Plastic Cell Architecture: Towards Reconfigurable Computing for General-Purpose," Proc. IEEE Workshop on FPGA-based Custom Computing Machines, (1998).
Peerlings et al., "Long Resonator Micromachined Tunable GaAs-AlAs Fabry-Perot Filter," IEEE Photonics Technology Letters, IEEE Service Center, Piscatawny, NJ, vol. 9, No. 9, Sep. 1997, pp. 1235-1237.
Wu et al., "MEMS Designed for Tunable Capacitors," Microwave Symposium Digest, 1998 IEEE MTT-S Int'l., Baltimore, MD, Jun. 7-12, 1998, vol. 1, pp. 127-129.
Zhou et al., "Waveguide Panel Display Using Electromechanical Spatial Modulators," SID Digest, vol. XXIX, 1998.
European Search Report Application No. 05255693.3-2217, dated May 24, 2006.
European Search Report Application No. EP 05 25 5673 in 9 pages, dated Jan. 23, 2006.
International Search Report and Written Opinion of the International Searching Authority for PCT/US2005/005919 dated Aug. 24, 2005.
International Search Report Application No. PCT/US2005/026448, Dated Nov. 23, 2005.
International Search Report Application No. PCT/US2005/029820, Dated Dec. 27, 2005.
International Search Report Application No. PCT/US2005/030962, Dated Aug. 31, 2005.
International Search Report Application No. PCT/US2005/034465, Dated Sep. 23, 2005.
Austrian Search Report No. 140/2005, Dated Jul. 15, 2005.
Austrian Search Report No. 161/2005, Dated Jul. 15, 2005.
Austrian Search Report No. 162/2005, Dated Jul. 14, 2005.
Austrian Search Report No. 164/2005, Dated Jul. 4, 2005.
Austrian Search Report No. 150/2005, Dated Jul. 29, 2005.
Austrian Search Report No. 144/2005, Dated Aug. 11, 2005.
Austrian Search Report No. 66/2005, Dated May 9, 2005.
Fan et al., "Channel Drop Filters in Photonic Crystals," Optics Express, vol. 3, No. 1, 1998.
Kim et al., "Control of Optical Transmission Through metals Perforated With Subwave-Length Hole Arrays," Optic Letters, vol. 24, No. 4, Feb. 15, 1999, pp. 256-257.
Lin et al., "Free-Space Michromachined Optical Switches for Optical Networking," IEEE Journal of Selected Topics in Quantum Electronics, vol. 5, No. 1m Jan./Feb. 1999, pp. 4-9.

Little et al., "Vertically Coupled Microring Resonator Channel Dropping Filter," IEEE Photonics Technology Letters, vol. 11, No. 2, 1999.

Magel, "Integrated Optic Devices Using Micromachined Metal Membranes," SPIE vol. 2686, 0-8194-2060-3/1996.

Science and Technology, The Economist, May 22, 1999, pp. 89-90.

ISR and WO for PCT/US2005/013462, filed Apr. 20, 2005.

Fork, et al., Chip on Glass Bonding Using StressedMetal™ Technology, SID 05 Digest, pp. 534-537, 2005.

Office Action issued Dec. 26, 2006 in ROC (Taiwan) App. No. 094114422.

IPRP for PCT/US05/013462 filed Apr. 20, 2005.

* cited by examiner

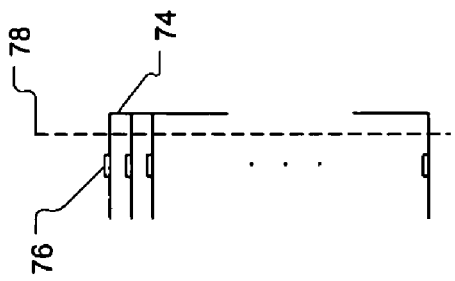
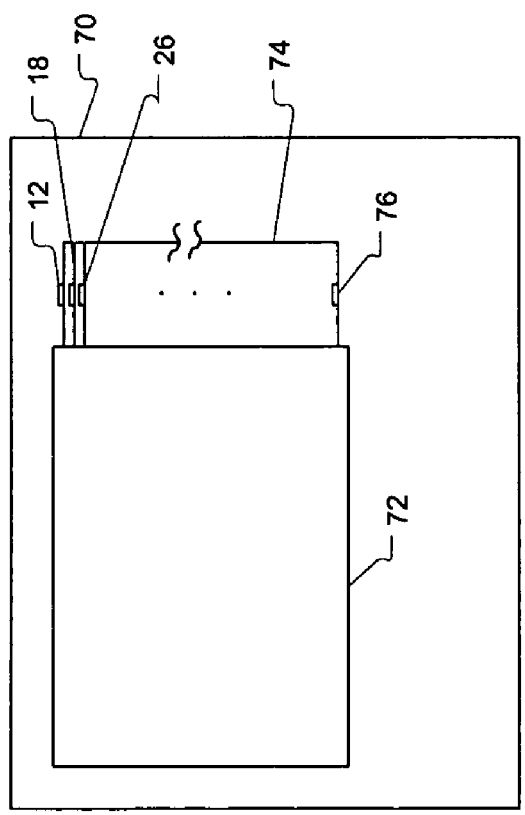
Figure 6b
Figure 6a

METHOD OF MANUFACTURE FOR MICROELECTROMECHANICAL DEVICES

BACKGROUND

Microelectromechanical system devices (MEMS) may be manufactured from thin film processes. These processes may involve a series of thin films deposited in layers, the layers being patterned and etched to form the devices. In order to allow the devices to move, one layer may be an isolation layer. An isolation layer is one that is used in forming the layers of the device acting as a structural member, but that may be removed when the device is complete.

Removal of the isolation layers may involve an etching process, using a material as the etchant that only acts on the sacrificial layer material. In some cases, the isolation layer may be an oxide that may be removed with a dry gas etch. Other forms of isolation layers are also possible, as are other methods of removal. The removal of the isolation layer typically results in a gap, through which a member of the device will move upon actuation.

MEMS devices often actuate through the use of electrical signals that cause a voltage differential between a first conductive layer and a second conductive layer separated by the gap. During dry, gas etching of the isolation layer, an electrostatic charge may build up on the layers, causing the movable member to become attracted to the other conductive layer. In extreme cases, the two layers may become stuck together and the device becomes inoperative. In less extreme cases, the movable element may become damages or deformed and subsequently not operate correctly.

BRIEF DESCRIPTION OF THE DRAWINGS

The invention may be best understood by reading the disclosure with reference to the drawings, wherein:

FIGS. 6a and 6b show embodiments of an alternative apparatus to mitigate the effects of static charge during an etch process.

DETAILED DESCRIPTION OF THE EMBODIMENTS

Figure 1:
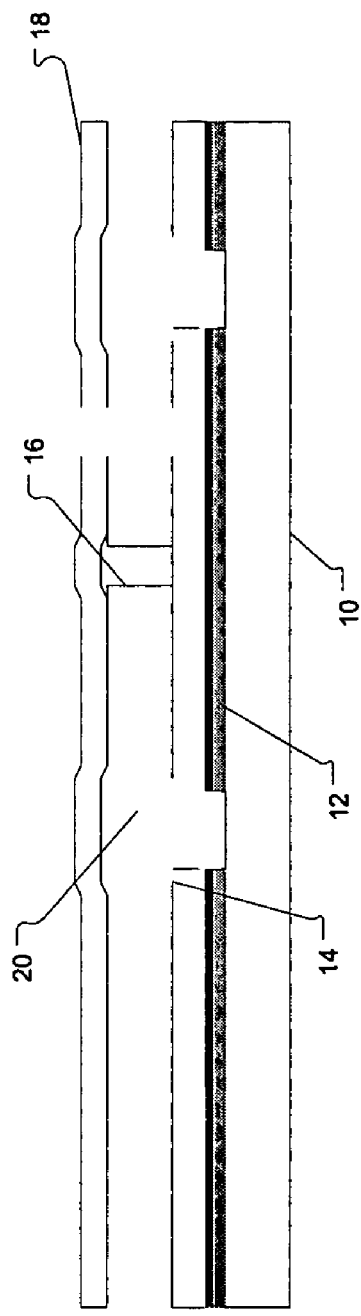
FIG. 1 shows an embodiment of a microelectromechanical device formed using an isolation layer.

FIG. 1 shows an example of a microelectromechanical device that is formed from thin film processes including an isolation layer. This particular example is of an interferometric modulator, but embodiments of the invention may be applicable to all kinds of MEMS devices that are formed from thin film processes with an isolation layer. The modulator is formed on a transparent substrate 10. An optical stack typically comprising layers of metal and oxides such as 12 and 14 is formed upon the substrate 10. A metal membrane 18 is formed upon a sacrificial layer, not shown. The sacrificial layer may also be referred to as an isolation layer, as it acts to electrically isolate conductive layers from each other during processing. Prior to the formation of the membrane, vias are patterned into the isolation layer to allow metal from the membrane to fill in the vias and form posts, such as 16.

Upon completion of the modulator structures, such as the metal membrane 18, the isolation layer is removed. This allows portions of the membrane 18 to deflect towards the electrode layer 12 of the optical stack. In the case of interferometric modulators, the membrane 18 is attracted to the metal layer 12 by manipulation of the voltage differential between the membrane 18 and the electrode layer 12. The layer 12 and the membrane 18 may be metal, as discussed here, or any conductive material. The cell formed by the portion of the membrane shown in FIG. 1 is activated by applying a voltage to the conductive layer 14, which differs from the voltage of the membrane at 18. This causes the membrane to become electrostatically attracted to the electrode, or first conductive, layer 12. The conductive layers may be metal or any other conductive material.

Figure 2:
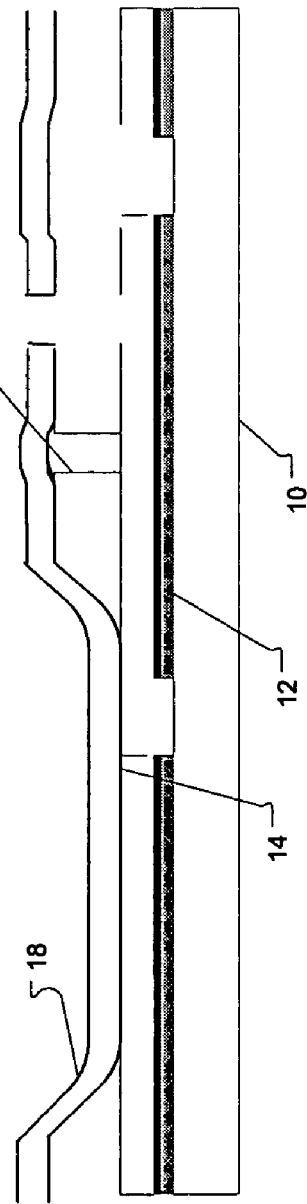
FIG. 2 shows an embodiment of a microelectromechanical device rendered inoperable by a static charge buildup during an etch process.

During removal of the isolation layer, enough electrostatic charge can build up on the surfaces of the two conductive layers to cause the membrane to attract towards the conductive layer 14 without being activated. This condition is shown in FIG. 2. This is normally the activated state of the interferometric modulator, but the difference is that the membrane does not release from the oxide layer 12 upon changing of the voltage potential. The membrane has assumed the activated state permanently. This may be caused by a combination sticking and friction, often referred to as stiction, aggravated by the electrostatic forces between the conductive layer 12 and the conductive membrane 18.

Removal of the isolation layer may be achieved in many different ways. Typically, it is removed with the use of a dry, gas etch, such as a xenon-difluorine ($XeF_2$) etch. While these are examples of etching processes, any etch process may be used. It may be the dry environment that contributes to the build up of the electrostatic charge. However, it would be better to not have to change the materials or basis of the processes used to manufacture the MEMS devices, but instead to adapt the process to eliminate the electrostatic charge build up.

There are some benefits to be obtained by grounding the conductive layers during wet etch processes as well. There may be effects on the device electrochemistry that are either enabled, if desirable, or mitigated, if undesirable, by grounding. In one embodiment, the layers are grounded together, the isolation layers are removed and the grounding left in place so the devices can be safely transported without fear of electrostatic discharge. This would be helpful if the etch were a wet etch or a dry etch.

The grounding process may be an external grounding, by an apparatus or mechanism external to the structure of the device. Alternatively, the grounding may be as part of the internal structure of the device enabled during manufacture. Initially, external grounding will be discussed.

Figure 3:
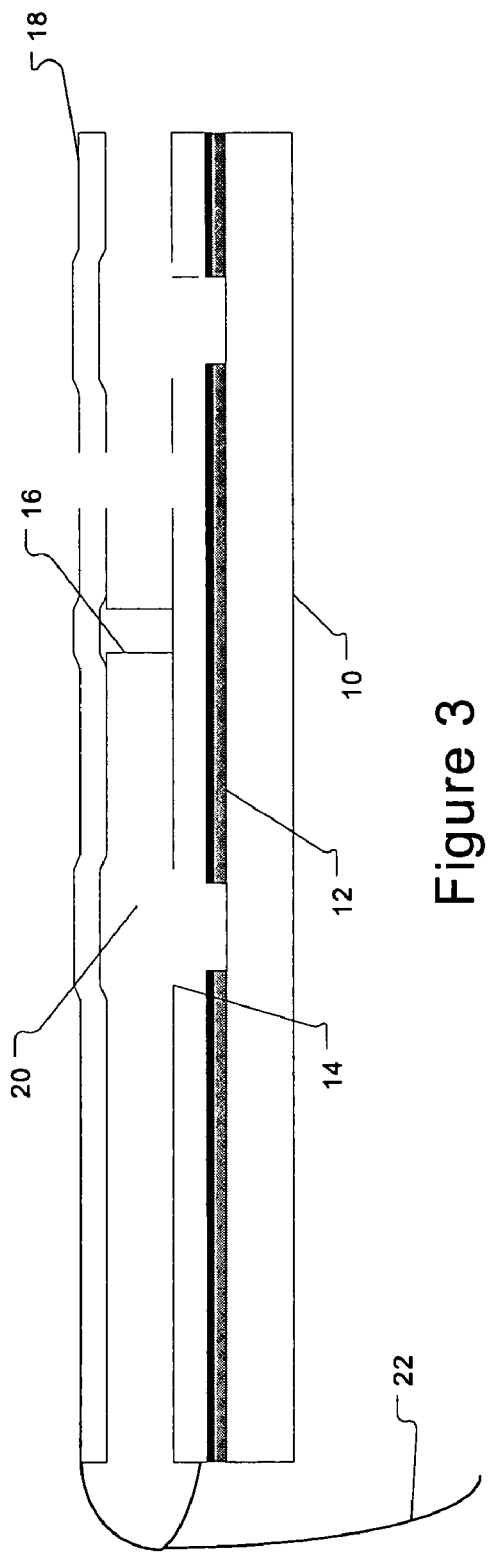
FIG. 3 shows an embodiment of an apparatus to mitigate the effects of static charge buildup during an etch process.
Figure 4:
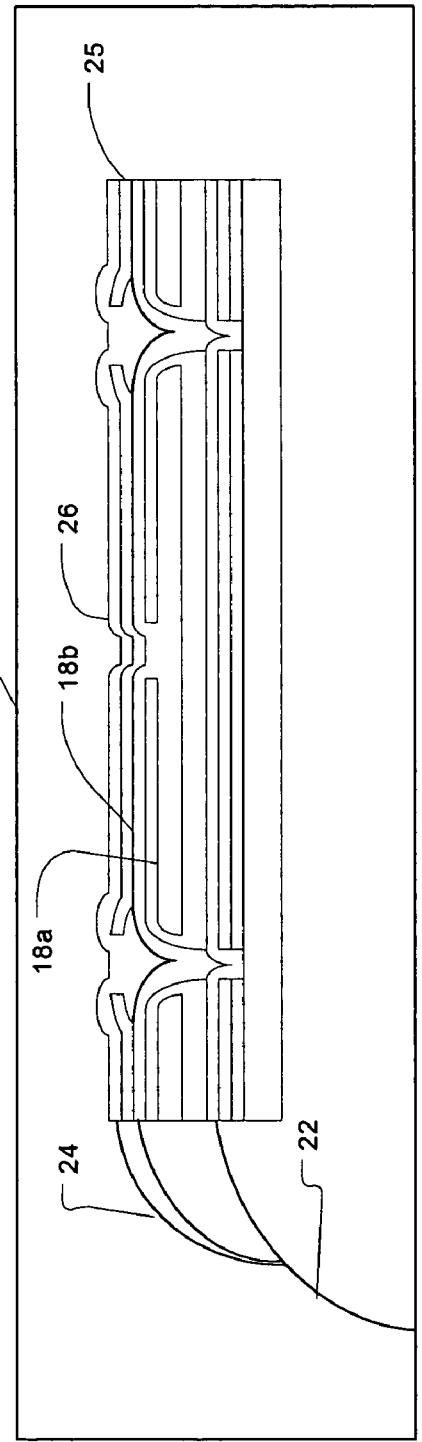
FIG. 4 shows an alternative embodiment of an apparatus to mitigate the effects of static charge during an etch process.

An apparatus for mitigating the build up of electrostatic charge during etching processes is shown in FIG. 3. An alternative embodiment is shown in FIG. 4. In FIG. 3, a conductive wire 22 has been attached to the first and second conductive layers 14 and 18 to hold them at the same potential. The same potential could involve attaching them to a ground plane, or just attaching them together. By holding them at the same potential, the electrostatic charge build up will not cause a differential between the two layers, and will therefore avoid the problem of having the membrane actuate during the etch process. As will be discussed in more detail further, this will typically be done just prior to the etch process, although the two layers could be electrically coupled together at any point prior to the etch process. It may be desirable to restrict the electrical coupling to the inactive area of the substrates upon which the devices are manufactured.

The alternative embodiment of FIG. 4 shows a device being manufactured out of three conductive layers and two isolation layers. In this embodiment of an interferometric modulator, the equivalent to the second conductive layer 18 in FIGS. 1 and 3 is actually two conductive layers 18*a* and 18*b*. They are generally deposited as two separate layers but are in physical or electrical connection with each other. This will typically result in the combination of the flex layer and the mirror layer only requiring one connection to be connecting with the other conductive layers. This particular formation may require two isolation layers as the equivalent of the first isolation layer, because a isolation layer may be formed between the layers 18*a* and 18*b* in addition to the one formed between layer 18*a* and the electrode layer 12. The connection between layers 18*a* and 18*b* may be formed by a via in the second portion of the first isolation layer. For purposes of discussion here, this isolation layer is not of interest in that the conductive layer deposited upon does not generally need a conductive wire to connect it to the other conductive layers.

A second isolation layer 25 may be formed on the flex layer 18*b*, to provide a separation between the conductive layer 18*b* and a third conductive layer 26. The third conductive layer in this example is the bus layer, used to form a signaling bus above the flex and mirror layers to aid in addressing of the cells of the modulator. Regardless of the application or the MEMS device in which embodiments of the invention may be employed, this is just intended as an example of multiple conductive layers being electrically coupled to mitigate or eliminate the electrostatic charge build up during the etch process.

Also shown in FIG. 4 is an alternative to a connection between the two layers alone. In FIG. 24, the conductive wire 22 is attached to a ground plane, in this example the frame of the etch chamber 30. This may be more desirable than having the two or more layers electrically connected together, as they will be to a 'known' potential, that is ground. Alternatively, the conductive wires 22 and 24 could be attached to other structures. As long as the two or more layers are held at the same potential, the build up of electrostatic charge should not cause the membrane to be attracted to the conductive layer on the substrate.

Figure 5:
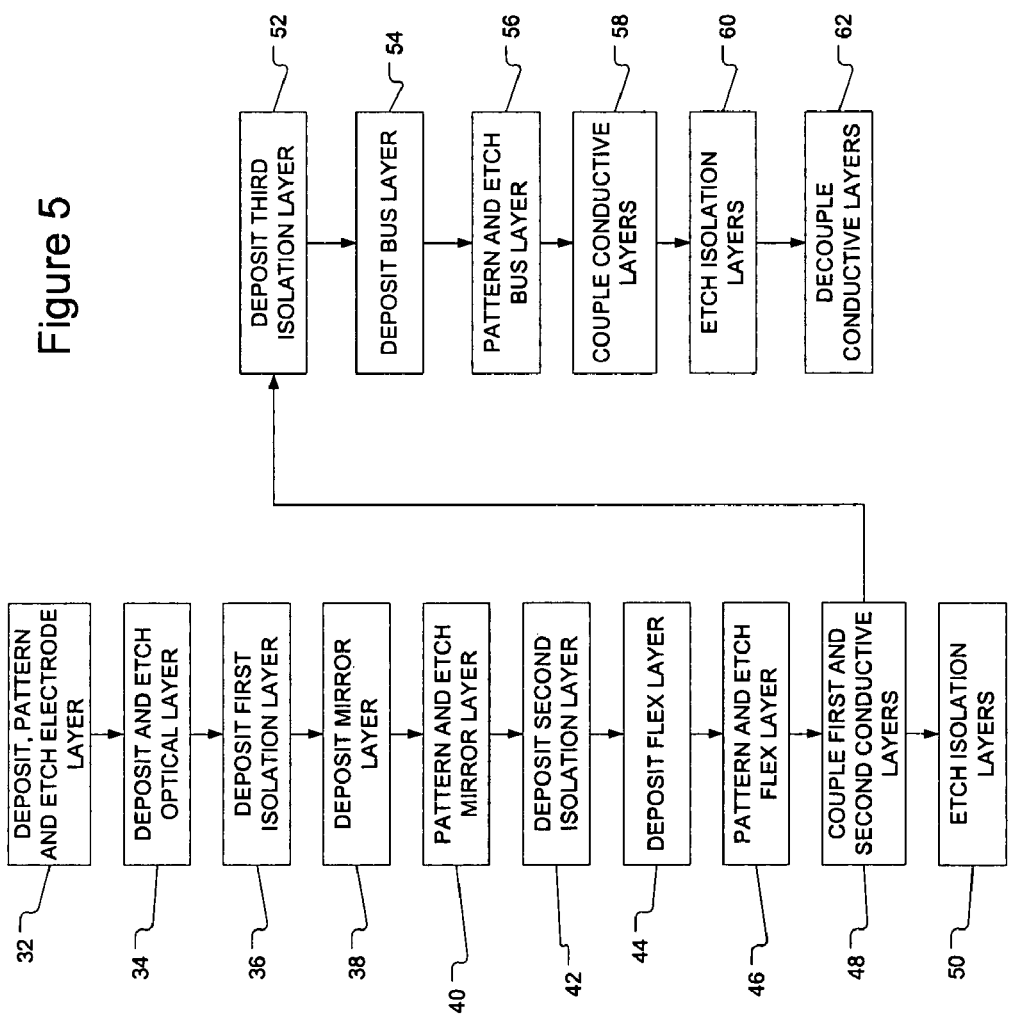
FIG. 5 shows a flowchart of an embodiment of a method to manufacture a microelectromechanical device.

As mentioned previously, it is probably more desirable to use a means of avoiding or mitigating electrostatic charge build up that does not interfere with current process flows for manufacturing of MEMS devices. An example of a method of manufacturing a MEMS device, in this case the interferometric modulator mentioned previously, is shown in flowchart form in FIG. 5.

It must be noted that the process flow given as a particular example in this discussion is for an interferometric modulator. However, embodiments of this invention may be applied to any MEMS device manufacturing flow having isolation layers removed by dry, gas etching. As discussed previously, the interferometric modulator is built upon a transparent substrate such as glass. An electrode layer is deposited, patterned and etched at 32 to form electrodes for addressing the cells of the modulator. The optical layer is then deposited and etched at 34. The first isolation layer is deposited at 36, then the mirror layer at 38. In this example, the first conductive layer will be the mirror layer.

The first conductive layer is then patterned and etched at 40. A second isolation layer is deposited at 42. Again, this is specific to the example of FIG. 4, in which the second conductive layer is actually formed from two conductive layers, the flex layer and the mirror layer. The first and second isolation layers may be treated as one isolation layer, as the electrostatic charge buildup between the conductive layers on either side of the second isolation layer is not a concern. The flex layer is then deposited at 44, and patterned and etched at 46.

At 48, the typical process flow is altered to include the grounding of the first and second conductive layers, in this case the electrode layer and the mirror/flex layer. For a device having two conductive layers and one effective isolation layer, the process may end at 50, with the isolation layer being removed with an etch. This is only one embodiment, and the ending of the process is therefore shown in a dashed box. For a device having more than two conductive layers, the process may instead continue at 52.

At 52 a third isolation layer is deposited at 52 in this particular example. As discussed above, this may actually be only a second, effective isolation layer. The bus layer, or third conductive layer, is deposited at 54, patterned and etched at 56. At 58, the conductive layers, in this example there are three, are grounded or electrically coupled together at 58, and the isolation layers are removed at 60. Depending upon the functionality of the device and the electrical drive scheme, the conductive layers may be decoupled at 62. For the example of the interferometric modulator, where the operation of the device relies upon the electrostatic attraction arising between conductive layers being held at different voltage potentials, the coupling would have to be removed.

The wire coupling is an example of an external process of coupling the conductive layers. Other external examples include using test probe structures to provide coupling between the layers, and the use of an ionized gas, where the molecules of the gas itself provides coupling between the layers.

It must be noted that the process of connecting the layers together, or connecting them all to the same potential is referred to as coupling the layers. This is intended to cover the situations in which the layers are just connected together, connected together to a common potential where that potential includes ground, or connected individually to a common or same potential. No restriction on how the layers are electrically coupled together is in intended.

An example of an internal grounding apparatus is shown in FIGS. 6*a* and 6*b*. As part of the manufacture of the MEMS devices, typically many devices are manufactured on one substrate, a portion of which is shown at 70 in FIG. 6*a*. During manufacture of the device, leads may be provided from the various layers, such as the electrode layer 12, the mechanical or mirror layer 18, and the bussing layer 26, of the device to test pads or tabs such as 76. It is possible to couple these pads together, such as by connection 74 that ties all of the pads together, as part of the conductive layer patterning and etching processes of manufacturing the devices. This would couple the conductive layers together for further processing.

As mentioned above, for devices that cannot operate with the layers coupled together, this internal coupling would have to be removed. As shown in FIG. 6*b*, the connections between the pads 76 and the coupling connection 74 could be broken. When the substrate is divided up into its individual devices, it may be sawn, scribed, or otherwise broken. The lines used to form the breaks, such as the scribe line 78, would sever the coupling between the pads 76 and the coupling connection 74. This is an example of internal coupling.

In this manner, MEMS devices having conductive layers and at least one isolation layer can be etched using current processes while avoiding electrostatic charge build up that may render the devices inoperable. Prior to packaging, and typically upon removal of the device from the etch chamber, the connections are removed or otherwise eliminated from the devices.

Thus, although there has been described to this point a particular embodiment for a method and apparatus for mitigating or eliminating the effects of electrostatic charge during etch processes, it is not intended that such specific references be considered as limitations upon the scope of this invention except in-so-far as set forth in the following claims.

What is claimed is:

1. A method of manufacturing a microelectromechanical device, comprising:
    forming at least a first and a second conductive layer on a substrate;
    forming an isolation layer between the two conductive layers;
    electrically coupling the conductive layers together using a solid conductor to provide electrical connection to the conductive layers;
    removing the isolation layer to form a gap between the first conductive layer and the second conductive layer; and
    electrically decoupling the conductive layers after removing the isolation layer.

2. The method of claim 1, further comprising forming a third conductive layer.

3. The method of claim 2, wherein forming an isolation layer further comprises forming two isolation layers.

4. The method of claim 1, wherein removing the isolation layer comprises performing an etch of the isolation layer.

5. The method of claim 4, wherein performing an etch comprises performing a dry gas etch.

6. The method of claim 5, wherein performing a dry gas etch comprises performing a xenon-difluorine etch.

7. The method of claim 1, wherein electrically coupling the conductive layers together comprises coupling the conductive layers together using an external coupling.

8. The method of claim 1, wherein electrically coupling comprises electrically coupling the conductive layers together during fabrication of at least a portion of the MEMS device.

9. The method of claim 1, wherein electrically coupling the conductive layers together comprises coupling the conductive layers together by forming one or more coupling connections over the substrate.

10. The method of claim 1, wherein electrically coupling the conductive layers together comprises using a conductive wire to provide electrical connection to the conductive layers.

11. The method of claim 1, wherein electrically coupling the conductive layers together comprises using a conductive wire to provide electrical connection to the conductive layers and then connecting the wire to a common voltage potential.

12. The method of claim I, wherein electrically coupling the conductive layers together comprises using conductive wires for each conductive layer and electrically connecting all of the wires to the same potential.

13. The method of claim 1, wherein electrically coupling the conductive layers together comprises electrically coupling the conductive layers together in an inactive area of the substrate.

14. The method of claim 1, wherein electrically decoupling the conductive layers comprises physically separating a conductive lead between the conductive layers.

* * * * *

UNITED STATES PATENT AND TRADEMARK OFFICE
CERTIFICATE OF CORRECTION

PATENT NO.         : 7,476,327 B2                                                      Page 1 of 1
APPLICATION NO.    : 10/839329
DATED              : January 13, 2009
INVENTOR(S)        : Tung et al.

It is certified that error appears in the above-identified patent and that said Letters Patent is hereby corrected as shown below:

At Column 6, Line 21, claim 12 please delete "claim I," and insert therefore --claim 1,--.

Signed and Sealed this

Thirtieth Day of June, 2009

JOHN DOLL
*Acting Director of the United States Patent and Trademark Office*